(12) United States Patent
Schauer et al.

(10) Patent No.: US 7,922,813 B2
(45) Date of Patent: *Apr. 12, 2011

(54) EPITAXIALLY COATED SILICON WAFER AND METHOD FOR PRODUCING EPITAXIALLY COATED SILICON WAFERS

(75) Inventors: Reinhard Schauer, Laufen (DE); Christian Hager, Kastl (DE)

(73) Assignee: Siltronic AG, Munich (DE)

( * ) Notice: Subject to any disclaimer, the term of this patent is extended or adjusted under 35 U.S.C. 154(b) by 832 days.

This patent is subject to a terminal disclaimer.

(21) Appl. No.: 11/521,980

(22) Filed: Sep. 15, 2006

(65) Prior Publication Data

US 2007/0062438 A1   Mar. 22, 2007

(30) Foreign Application Priority Data

Sep. 22, 2005 (DE) .......................... 10 2005 045 338

(51) Int. Cl.
*C30B 21/02* (2006.01)

(52) U.S. Cl. ................. 117/84; 117/90; 117/95

(58) Field of Classification Search .................... 117/84, 117/90, 95, 97
See application file for complete search history.

(56) References Cited

U.S. PATENT DOCUMENTS

| | | | |
|---|---|---|---|
| 4,057,939 A * | 11/1977 | Basi | 451/36 |
| 5,400,548 A | 3/1995 | Huber et al. | |
| 5,532,183 A * | 7/1996 | Sugawara | 438/253 |
| 6,277,715 B1 | 8/2001 | Takeno et al. | |
| 6,478,883 B1 | 11/2002 | Tamatsuka et al. | |
| 6,630,024 B2 * | 10/2003 | Schmolke et al. | 117/106 |
| 6,899,762 B2 | 5/2005 | Wenski et al. | |
| 6,995,077 B2 * | 2/2006 | Siebert et al. | 438/478 |
| 2001/0032581 A1 | 10/2001 | Wilson et al. | |
| 2001/0039917 A1 | 11/2001 | Arai et al. | |
| 2003/0068502 A1 | 4/2003 | Togashi et al. | |
| 2003/0104222 A1 | 6/2003 | Ono et al. | |

(Continued)

FOREIGN PATENT DOCUMENTS

DE    198 33 257 C1    9/1999

(Continued)

OTHER PUBLICATIONS

Doubleside polishing-a technologymandatoryfor 300mm wafer manufacturing G. Wenski*, T. Altmann, W. Winkler, G. Heier, G. H.olker Department B-LW-TP, Wacker Siltronic AG, P.O. Box 1140, D-84479 Burghausen, Germany Materials Science in Semiconductor Processing 5 (2003) 375-380, pp. 375-380.*

(Continued)

*Primary Examiner* — Robert M Kunemund
(74) *Attorney, Agent, or Firm* — Brooks Kushman P.C.

(57) ABSTRACT

Epitaxially coated silicon wafers, are produced by epitaxially coating a multiplicity of wafers polished at least on their front sides, successively and individually in an epitaxy reactor, by placing a silicon wafer on a susceptor, pretreating under a hydrogen atmosphere followed by addition of an etching medium to the hydrogen atmosphere, coating epitaxially on the polished front side and removing the water from the epitaxy reactor. The susceptor is then heated, in each case, to a temperature of at least 1000° C. under a hydrogen atmosphere, and furthermore an etching treatment of the susceptor and a momentary coating of the susceptor with silicon are effected after a specific number of epitaxial coatings. Silicon wafers characterized by a parameter R30-1 mm of −10 nm to +10 nm, determined at a distance of 1 mm from the edge of the silicon wafer are produced.

14 Claims, 9 Drawing Sheets

U.S. PATENT DOCUMENTS

| | | |
|---|---|---|
| 2003/0175532 A1 | 9/2003 | Asayama et al. |
| 2004/0005777 A1 | 1/2004 | Qu et al. |
| 2004/0065250 A1 | 4/2004 | Komiya et al. |
| 2004/0089225 A1 | 5/2004 | Ono et al. |
| 2004/0115941 A1 | 6/2004 | Siebert et al. |
| 2004/0241992 A1 | 12/2004 | Kono et al. |
| 2005/0087830 A1 | 4/2005 | Takeno |
| 2005/0160971 A1 | 7/2005 | Otsuka |
| 2006/0201413 A1 | 9/2006 | Nishizawa |
| 2007/0066036 A1* | 3/2007 | Schauer et al. ............... 438/478 |
| 2008/0118712 A1* | 5/2008 | Schauer et al. ............... 428/172 |

FOREIGN PATENT DOCUMENTS

| | | |
|---|---|---|
| DE | 199 38 340 C1 | 2/2001 |
| DE | 100 25 871 A1 | 12/2001 |
| EP | 0 272 531 A1 | 6/1988 |
| EP | 0 547 894 A1 | 6/1993 |
| EP | 0 580 162 A1 | 1/1994 |
| EP | 1209251 A2 | 5/2002 |
| JP | 2001508599 | 6/2001 |
| JP | 2003 163216 A | 6/2003 |
| JP | 2003 309707 A | 10/2003 |
| JP | 2003 318109 A | 11/2003 |
| JP | 2004 175658 A | 6/2004 |
| JP | 165489 A | 6/2004 |
| JP | 2004-243505 A | 9/2004 |
| JP | 2004253751 A | 9/2004 |
| JP | 2004 335528 A | 11/2004 |
| JP | 2004 356416 A | 12/2004 |
| JP | 2005 011880 A | 1/2005 |
| JP | 2005 39111 A | 2/2005 |
| JP | 2005 197278 A | 7/2005 |
| TW | 1227286 | 8/1988 |
| TW | 1228549 | 3/2005 |
| WO | 9832893 | 7/1998 |
| WO | WO 03/044845 A1 | 5/2003 |
| WO | WO 2005/001916 A1 | 1/2005 |

OTHER PUBLICATIONS

Mike Seacrist, SCP Symposium_Jun. 2005_Seacrist Silicon Starting Materials for Sub-65nm Technology Nodes MEMC Electronic Materials, St. Peters MO, 63376 pp. 1-10.*

Wafer-Edge Challenges SEMI STEP Wafer Edge Profile SEMICON/West 2006 Tetsuo Fukuda SEMI Japan (Fujitsu) Japan Advanced Wafer Geometry Task Force Semi Japan pp. 1-21 PwrPt Presentation.*

English Abstract corresponding to JP 2003309707 A.

English Abstract corresponding to JP 2003318109 A.

English Abstract corresponding to JP 2003163216 A.

English Abstract corresponding to JP 2004335528 A.

English Abstract corresponding to JP 2004356416 A.

English Abstract corresponding to JP 2005039111 A.

English Abstract corresponding to JP 2005197278 A.

English Abstract corresponding to JP 2005011880 A.

English Abstract corresponding to JP 2004165489 A.

English Abstract corresponding to WO 03/044845 A1.

U.S. Publication No. 2004/0089225A1 is the English equivalent to JP 2004175658 A.

U.S. Patent No. 6,478,883 B1 is the English equivalent to TW 1227286.

U.S. Publication No. 2001/0032581 A1 is the English equivalent to TW 1228549.

English Derwent Abstract AN 1999-519699 corresponding to DE 198 33 257C1.

Japanese Journal of Applied Physics, vol. 38, (1999), pp. 38-39.

Tsutomu et al. "Precise Measurement of Wafer Geometry Using Interferometric Methods", Kobe Steel Engineering Reports, Japan, vol. 55, No. 1, Apr. 2005, p. 45-47.

* cited by examiner

EPITAXIALLY COATED SILICON WAFER AND METHOD FOR PRODUCING EPITAXIALLY COATED SILICON WAFERS

BACKGROUND OF THE INVENTION

1. Field of the Invention

The invention relates to an epitaxially coated silicon wafer and a method for producing epitaxially coated silicon wafers.

2. Background Art

Epitaxially coated silicon wafers are suitable for use in the semiconductor industry, in particular for the fabrication of large scale integrated electronic components such as microprocessors or memory chips. Starting materials (substrates) with stringent requirements are required for modern microelectronics, for example global and local flatness, edge geometry, thickness distribution, single-side-reference local flatness (nanotopology) and freedom from defects.

According to the prior art, a silicon wafer can be produced by a process sequence of separating a single crystal of silicon into wafers, rounding the mechanically sensitive edges, carrying out an abrasive step such as grinding or lapping followed by a polishing. EP 547894 A1 describes a lapping method; grinding methods are claimed in the applications EP 272531 A1 and EP 580162 A1.

The final flatness is generally produced by a finish polishing, which may be preceded, if appropriate, by an etching step for removing disturbed crystal layers and for removing impurities. A suitable etching method is known from DE 19833257 C1, by way of example. While traditional single-side polishing methods generally lead to poorer plane-parallelisms, polishing methods acting on both sides ("double-side polishing") make it possible to produce silicon wafers with improved flatness. In the case of polished silicon wafers, the desire is to achieve the required flatness by suitable processing steps such as grinding, lapping and polishing.

On the other hand, DE 19938340 C1 describes providing a monocrystalline silicon wafer with a layer grown in monocrystalline fashion and made of silicon with the same crystal orientation, a so-called epitaxial coating, on which electronic components are later applied. Epitaxially coated silicon wafers have certain advantages over silicon wafers made of homogeneous material, for example in preventing charge reversal in bipolar CMOS circuits followed by short circuiting of the component ("latch-up"); lower defect densities, for example reduced number of COPs ("crystal-originated particles"); and also the absence of appreciable oxygen content, which precludes the risk of short-circuiting due to oxygen precipitates in component-relevant regions.

According to the prior art, epitaxially coated silicon wafers are produced from suitable preliminary products by means of a process sequence of removal polishing-final polishing-cleaning-epitaxy. DE 10025871 A1, for example, discloses a method for producing a silicon wafer with an epitaxial layer deposited on the front side, comprising the following process steps:

(a) a removal polishing step as the sole polishing step;
(b) (hydrophilic) cleaning and drying of the silicon wafer;
(c) pretreatment of the front side of the silicon wafer at a temperature of 950 to 1250 degrees Celsius in an epitaxy reactor; and
(d) deposition of an epitaxial layer on the front side of the pretreated silicon wafer.

It is customary, in order to protect silicon wafers from particle loading, to subject the silicon wafers to a hydrophilic cleaning after polishing, in accordance with step (b) in the above process sequence. The hydrophilic cleaning produces a very thin native oxide layer with a thickness of approximately 0.5 to 2 nm, depending on the type of cleaning and measurement. The native oxide is removed during the course of pretreatment in the epitaxy reactor in accordance with (c), usually in a hydrogen atmosphere. This pretreatment step is also known to the person skilled in the art by the term "$H_2$ bake".

In a second step, likewise provided as a pretreatment step before the actual deposition of the epitaxial layer, the surface roughness of the front side of the silicon wafer is reduced and polishing defects are removed from the surface of the silicon wafer to be epitaxially coated. For this purpose, by way of example, an etching treatment with gaseous hydrogen chloride (HCl) is carried out by adding HCl to the hydrogen atmosphere.

Often, besides HCl, a silane source, for example silane ($SiH_4$), dichlorosilane ($SiH_2Cl_2$), trichlorosilane (TCS, $SiHCl_3$) or tetrachlorosilane ($SiCl_4$), preferably trichlorosilane, is also added to the hydrogen atmosphere in an amount such that silicon deposition and silicon etching removal are at equilibrium. Both reactions proceed at a sufficiently high reaction rate, however, so that silicon on the surface is mobile and the surface is smoothed and defects are removed on the surface. The silicon wafer that has been pretreated in this way subsequently acquires an epitaxial layer.

Epitaxy reactors, which are used in particular in the semiconductor industry for the deposition of an epitaxial layer on a silicon wafer, are described in the prior art. During all coating or deposition steps, one or more silicon wafers are heated by means of heating sources, preferably by means of upper and lower heating sources, for example lamps or lamp banks, and subsequently exposed to a gas mixture, comprising a source gas (silanes), a carrier gas (e.g. hydrogen) and, if appropriate, a doping gas (e.g. diborane).

A susceptor, for example one made of graphite, SiC or quartz, serves as a support for the silicon wafer in the deposition chamber of the epitaxy reactor. During deposition of the epitaxial layer, the silicon wafer rests on the susceptor or in milled-out portions of the susceptor in order to ensure uniform heating and to protect the rear side of the silicon wafer, on which generally no layer is deposited, from the source gas.

In accordance with the prior art, the process chambers of epitaxy reactors are designed for one or more silicon wafers. In the case of silicon wafers having relatively large diameters (greater than or equal to 150 mm), single wafer reactors are usually used since the latter are known for good epitaxial layer thickness regularity. The uniformity of the layer thickness can be optimized by various measures, for example by altering the gas flows ($H_2$, $SiHCl_3$), by incorporating and adjusting gas inlet devices (injectors), by changing the deposition temperature, or by alterations to the susceptor.

In epitaxy, it is customary, after one or more epitaxial depositions on silicon wafers, to carry out an etching treatment of the susceptor without a substrate, during the course of which the susceptor and also other parts of the process chamber are freed of silicon deposits. This etch, using hydrogen chloride (HCl), for example, is often already carried out after the processing of a small number of silicon wafers (1-5) in the case of single wafer reactors, and is not carried out until after the processing of a greater number of silicon wafers (10-20) when thin epitaxial layers are deposited.

It has been shown in the prior art that some of the epitaxially coated silicon wafers have a significantly poorer local flatness in the edge region. Thus, by way of example, if an etching treatment of the susceptor is carried out after 4 epitaxial depositions, it may be observed that in each case one of the silicon wafers that are epitaxially coated between two susceptor treatments exhibits a significantly poorer local flatness in the edge region, which in this case has the consequence that 25% of the epitaxially coated silicon wafers do not meet local flatness requirements.

Moreover, the silicon wafers epitaxially coated in accordance with the prior art exhibit an undesirable further decrease in their thickness in the edge region (edge roll-off), which already occurs to some extent in the polished silicon wafers, the silicon wafers usually being polished concavely in order to restrict the edge roll-off to only an outer edge region. A concavely polished silicon wafer is thinner in the center, then increases in its thickness toward the edge and has a decrease in thickness only at the edge.

The edge geometry is usually quantified by specifying one or more edge roll-off parameters which usually relate to the total thickness of a silicon wafer or to the edge geometry of its front and/or rear side, and which can be used to characterize the customarily observed decrease in the thickness of the silicon wafer in its edge region, or the flatness of front and/or rear side of the silicon wafer in its edge region. One method for measuring the edge roll-off of silicon wafers is described in JPN. J. APPL. PHYS., vol. 38 (1999), pp. 38-39.

Edge roll-off parameters relating to the thickness of a silicon wafer can be determined by means of a NanoPro NP1 topography measuring system from KLA Tencor, for example, by firstly calculating 360 radial cross sections with a spacing of 1° of the entire map (topography, "Wafer Map") of a silicon wafer, starting in the center of the wafer. The cross sections are usually divided into 4 sectors S2 to S5 (90° sectors in each case) and all 90 radial cross sections are averaged for each sector. A matched third order reference line ("best fit") is calculated for a range of a distance of R-5 mm to R-35 mm from the edge of the wafer. Finally, the fourfold symmetry of the edge roll-off is averaged out (by averaging over all the radial thickness cross sections), and an R30-1 mm parameter is produced, for example, by determining the deviation between the averaged radial cross section and the reference line determined by regression for a distance of R-1 mm from the edge of the wafer. Usually an R30-3 mm parameter for a distance of 3 mm and an R30-2 mm parameter for a distance of 2 mm from the edge of the silicon wafer and possibly intermediate values are determined as well. If the silicon wafer has an edge roll-off, the corresponding R30 parameters have a negative sign.

As an alternative, it is also possible to consider the deviations between average radical cross sections per sector (single traces) and the reference line and thus to obtain a roll-off value for each sector. However, average edge roll-off values are always considered in the context of the present invention.

In the case of silicon wafers which are polished and subsequently epitaxially coated in accordance with the prior art, the R30-1 mm edge roll-off parameter referring to the thickness of the silicon wafer has a magnitude of 100 nm or higher. By way of example, the following values were determined for a silicon wafer epitaxially coated in accordance with the prior art: an R30-3 mm of −42 nm, an R30-2 mm of −105 nm and an R30-1 mm of −304 nm.

SUMMARY OF THE INVENTION

Therefore, an object of the invention was to provide a method for epitaxially coating silicon wafers which, on the one hand makes a higher yield possible, and on the other hand makes it possible to produce epitaxially coated silicon wafers with a low edge roll-off. These and other objects are independently achieved by a process in which wafers are individually and successively coated, each wafer being baked, etched, and epitaxially coated, and following the processing of a specific number of wafers, the susceptor is baked, etched, and briefly coated with silicon.

DETAILED DESCRIPTION OF THE PREFERRED EMBODIMENT(S)

Thus, the invention pertains to a method for producing epitaxially coated silicon wafers, in which a multiplicity of silicon wafers which are polished at least on their front sides are provided and successively coated individually in an epitaxy reactor by a procedure in which one silicon wafer is placed on a susceptor in the epitaxy reactor, is pretreated under hydrogen atmosphere in a first step, and with addition of an etching medium to the hydrogen atmosphere in a second step, is subsequently coated epitaxially on its polished front side, and is removed from the epitaxy reactor, and afterward the susceptor is heated to a temperature of at least 1000° C. under a hydrogen atmosphere, and furthermore an etching treatment of the susceptor and a momentary coating of the susceptor with silicon are effected after a specific number of epitaxial coatings.

In the method according to the invention, firstly, a multiplicity of silicon wafers which are polished at least on their front sides are provided. For this purpose, a silicon single crystal produced according to the prior art, preferably by crucible pulling according to Czochralski, is separated into a multiplicity of silicon wafers by means of known separation methods, preferably by wire sawing with free ("slurry") or bonded grain (diamond wire). Furthermore, mechanical processing steps are effected, such as sequential single-side grinding methods (SSG), simultaneous double-side grinding methods (double-disk grinding", DDG) or lapping. The edge of the silicon wafer including optionally present mechanical markings such as an orientation notch or an essentially rectilinear flattening of the silicon wafer edge ("flat"), is generally processed as well (edge rounding "edge-notch-grinding"). Chemical treatment steps comprising cleaning and etching steps are additionally provided.

After the grinding, cleaning and etching steps, the surface of the silicon wafers is smoothed by removal polishing. In the case of single-side polishing (SSP), silicon wafers are held during processing on the rear side on a carrier plate by means of cement, by vacuum or by means of adhesion. In the case of double-side polishing (DSP), silicon wafers are inserted loosely into a thin toothed disk and polished on the front and rear sides simultaneously in a manner "floating freely" between an upper and a lower polishing plate covered with a polishing cloth.

The front sides of the silicon wafers are then preferably polished in a haze-free manner, for example using a soft polishing cloth with the aid of an alkaline polishing sol. In order to obtain the flatness of the silicon wafers produced up to this step, the material removals are relatively small, preferably 0.05 to 1.5 μm. This step is often referred to as CMP polishing (chemo-mechanical polishing) in the literature.

After polishing, the silicon wafers are subjected to a hydrophilic cleaning and drying according to the prior art. The cleaning may be performed either as a batch method with simultaneous cleaning of a multiplicity of silicon wafers in baths, by spraying methods, or as a single wafer process.

The silicon wafers provided are preferably wafers made of monocrystalline silicon, SOI ("silicon-on-insulator") wafers, wafers having a strained silicon layer ("strained silicon") or sSOI ("strained silicon-on-insulator") wafers. Suitable methods for producing SOI and sSOI wafers such as the Smart-Cut® process and methods for producing wafers having strained silicon layers are disclosed in the prior art.

The actual epitaxial coating of a silicon wafer is preceded in each case by a treatment of the silicon wafer comprising a treatment of the silicon wafer under a hydrogen atmosphere and a treatment of the silicon wafer with an etching medium. The pretreatment under a hydrogen atmosphere is preferably effected at a hydrogen flow rate of 0-100 slm (Standard Liter per Minute), more preferably 30-60 slm, preferably for a finite time period within the range of 0-120 s ($H_2$ bake). The removal of native oxide on the front and rear sides of the silicon wafer to be epitaxially coated can be controlled by the duration of this pretreatment in a hydrogen atmosphere.

The hydrogen pretreatment is followed by treatment with an etching medium. Hydrogen chloride is preferably used as the etching medium, by adding hydrogen chloride to the hydrogen atmosphere, preferably in an amount of 5-20% by volume, such that the removal rate during the etching treatment is 0.01-0.2 μm/min (HCl etch). In this case, the hydrogen flow rate is preferably 0-100 slm, preferably 30-60 slm. The pretreatment with addition of hydrogen chloride is preferably effected for a fintie time period within the range of 0-120 s. The height of an epitaxial layer that is to be grown later can be set by the duration of this pretreatment with the etching medium. The etching treatment additionally causes mass displacements on the rear side of the silicon wafer due to silicon being etched away at one location and deposited at another location on the rear side of the silicon wafer.

If the initial geometry of the silicon wafer has an edge roll-off after polishing, it is possible, by a suitable choice of the treatment duration with the etching medium, to apply an elevation on the rear side of the silicon wafer which at least partly compensates for the edge roll-off; to be precise at those locations on the rear side of the silicon wafer at which native oxide was removed by the pretreatment with hydrogen. This is done before the actual deposition of the epitaxial layer on the silicon wafer. Thus, by way of example, in the case of a silicon wafer having an edge roll-off of 120 nm at a distance of 2 mm from the edge, it is possible, by means of an $H_2$ bake pretreatment for 120 s at a flow rate of 60 slm and an HCl etching treatment for 120 s at an $H_2$ flow rate of 50 slm, to apply an elevation of 120 nm at a distance of 2 mm from the edge on the rear side of the silicon wafer, which practically completely compensates for the edge roll-off R30-2 mm. Consequently, it is possible, in the case of the silicon wafer to be epitaxially coated, to achieve an improved local flatness in the edge region and a smaller edge roll-off as a result of its pretreatment.

The R30 values for distances of 1 mm, 2 mm and 3 mm from the edge of the silicon wafer to be epitaxially coated are preferably known, so that the duration and flow rates during $H_2$ bake and HCl pretreatment are preferably selected be chosen such that the roll-off which the silicon wafer has after polishing is at least partly compensated for at a distance of 1 mm from the edge of the silicon wafer. This may have the effect that at distances of 2 mm and 3 mm from the edge of the silicon wafer, there is applied on the rear side thereof a higher silicon layer than is necessary on account of the original R20 and R30 values, that is to say that the R30-2 mm and R30-3 mm parameters change their sign. In other words, a roll-up rather than a roll-off may arise at these positions.

Moreover, it is possible and also preferred to overcompensate for the edge roll-off at R-1 mm during the pretreatment in the epitaxy reactor, so that at R-1 mm, too, a roll-up arises and the R30-1 mm becomes positive.

During the pretreatment of the silicon wafer in the epitaxy reactor, flow rates and treatment durations are preferably chosen such that a roll-off at R-1 mm is at most 10 nm (in terms of magnitude) and a roll-up is likewise at most 10 nm. Preferably, therefore, the R30-1 mm is at least −10 nm (roll-off) and at most +10 nm (roll-up). It is particularly preferred that the pretreatment is carried out in such a way that the R30-1 mm of the epitaxially coated silicon wafer lies between −5 n, and +5 nm.

After the pretreatment steps, an epitaxial layer is deposited on the polished front side of a silicon wafer. For this purpose, a silane source as source gas is added to hydrogen as carrier gas. The epitaxial layer is deposited at a temperature of 900-1200° C. depending on the silane source used. Trichlorosilane (TCS) is preferably used as the silane source, at a deposition temperature of 1050-1150° C. The thickness of the deposited epitaxial layer is preferably 0.5-5 μm.

After removal of the epitaxially coated silicon wafer from the susceptor, the susceptor is heated to a temperature of at least 1000° C., preferably to a temperature of at least 1100° C. According to the invention, the susceptor is preferably heated after each epitaxial coating of a silicon wafer and subsequent removal of the epitaxially coated silicon wafer from the process chamber. This heating of the susceptor is effected under a hydrogen atmosphere, that is to say as an $H_2$ bake step. After the susceptor has been heated to a temperature of at least 1000° C., it is kept at this temperature preferably for 5-15 s. As an alternative to the bake step under a hydrogen atmosphere, the susceptor can be coated with silicon at a comparable temperature. However, this is less preferred in the context of this invention.

After a specific number, preferably 3 to 6, of epitaxial coatings of silicon wafers in the epitaxy reactor, the susceptor is treated with an etching medium, no substrate being situated on the susceptor during this treatment. HCl is preferably used as the etching medium. The susceptor etching is preferably followed by a momentary coating of the susceptor with silicon. The coating is effected preferably for 10-60 s. A layer having a thickness of 0.5 μm is preferably deposited on the susceptor in the process.

It is necessary to momentarily heat the susceptor to above 1000° C. in order to establish identical conditions after the pretreatment for all of the silicon wafers to be epitaxially coated.

It has been shown that, in the prior art, the first silicon wafer that is epitaxially coated after an etching treatment of the susceptor in each case has a poorer local flatness in the edge region. This is associated with the fact that after an etching treatment of the susceptor, the susceptor surface is saturated with hydrogen. If a silicon wafer to be epitaxially coated is then placed onto the susceptor surface saturated with hydrogen, it is possible, during the pretreatment under a hydrogen atmosphere, for the hydrogen to diffuse between susceptor and silicon wafer through to far inward in the direction of the center of the silicon wafer and strip away native oxide there. During subsequent epitaxial coating, silicon can grow at the locations etched away on the rear side, in particular in the edge region of the silicon wafer, or else mass displacements may occur on the rear side of the silicon wafer.

However, during the pretreatment, part of the oxygen is transferred from the native oxide layer to the susceptor surface. This means that after the epitaxial coating of a first silicon wafer after the etching treatment of the susceptor, oxygen predominates on the susceptor surface, that is to say that the susceptor surface is hydrophilic. This has the effect that during the pretreatment of the next silicon wafer to be processed under a hydrogen atmosphere, the hydrogen is impeded from penetrating deeply between susceptor and silicon wafer since the excess oxygen on the susceptor surface reacts with the indiffusing hydrogen. This furthermore means that less or no native oxide is etched away on the rear side of the silicon wafer. Consequently, silicon also cannot grow on the rear side of the silicon wafer.

This explains the changes in local flatness in the edge region between first and second epitaxially coated silicon wafers after an etching treatment of the susceptor. It is thus also clear why, in the case of an etching treatment of the susceptor that is carried out after 4 epitaxy coatings, in each case one of the four epitaxially coated silicon wafers has significantly different local flatness values in its edge region.

In the method according to the invention, however, the conditions during the pretreatment are identical for all of the silicon wafers to be epitaxially coated. This is achieved by the susceptor being heated after each epitaxial coating. This is because heating the susceptor after each epitaxial coating has the same effect as if the susceptor had been treated with HCl before each epitaxial coating of a silicon wafer. This means that during the pretreatment in a hydrogen atmosphere, the hydrogen can penetrate more easily between susceptor and silicon wafer and etch away native oxide on the rear side of the silicon wafer.

Whereas, during the pretreatment of the silicon wafer in a hydrogen atmosphere, the oxide on the front side is removed relatively rapidly and uniformly over the entire area, for which, by way of example, a treatment for a duration of 20 seconds at a temperature of 1150° C. already suffices, the oxide on the rear side of the silicon wafer is not stripped away uniformly since the hydrogen that is principally responsible for stripping away the native oxide layer must first diffuse between silicon wafer and susceptor beforehand. In other words, while the oxide is removed completely on the front side of the silicon wafer, with the removal being effected relatively rapidly, the desired removal of native oxide on the rear side of the silicon wafer is set by a suitable choice of the hydrogen flow rate and the duration of the treatment.

During the subsequent pretreatment of the silicon wafer with an etching medium, preferably with hydrogen chloride, mass displacements occur on the rear side of the silicon wafer. Silicon is etched away at specific locations on the rear side (or else on the front side) of the silicon wafer and from the susceptor coated with silicon and deposits on locations freed of native oxide in the edge region on the rear side of the silicon wafer. Silicon cannot be deposited in those regions on the rear side of the silicon wafer at which native oxide is still situated.

Therefore, with the method according to the invention it is possible, during the pretreatments in a hydrogen atmosphere and with addition of an etching medium to the hydrogen atmosphere and prior to the actual epitaxial deposition, to apply on the rear side of the silicon wafer an elevation in the form of silicon material which at least partly compensates for the edge roll-off exhibited by the silicon wafer to be epitaxially coated. The height and extent of the application on the rear side of the silicon wafer can be set in a targeted manner by a suitable choice of the gas flows and the treatment durations.

A particular advantage of the inventive method is that as a result of the momentary heating of the susceptor, the conditions during the pretreatment are identical for all the silicon wafers, thus also leading to an increase in yield in addition to improved local geometry in the edge region of the epitaxially coated silicon wafers, and compensation of the edge roll-off by optimized pretreatment steps. Compared with a treatment of the susceptor with an etching medium which is to be carried out after every epitaxial deposition and would have essentially the same effect, this is neutral in respect of time since it is carried out during handling steps (e.g. during the preparation of the next silicon wafer to be epitaxially coated), and accordingly is also more cost-effective.

It has furthermore been found that with the method of the invention, it is possible to produce a silicon wafer comprising a front side and a rear side, at least the front side being polished and an epitaxial layer being applied on its front side, characterized by a parameter R30-1 mm of −10 nm to +10 nm, corresponding to a deviation, determined at a distance of 1 mm from the edge of the silicon wafer, of an average cross section determined by thickness measurement with respect to a reference line determined by regression.

This is achieved by optimized pretreatment steps, that is to say targeted setting of the treatment durations and the gas flows, in order, in a targeted manner, to deposit silicon material on the rear side of the silicon wafer and to provide the silicon wafer with an improved edge geometry even prior to the actual deposition of an epitaxial layer.

The epitaxially coated silicon wafers preferably have a parameter R30-1 mm of −5 nm to +5 nm. This very low R30-1 mm edge roll-off parameter signifies a significant improvement over prior art epitaxially coated silicon wafers.

Many different efforts have been made heretofore to minimize the edge roll-off of substrates for epitaxy, concave polishing generally constituting the only possibility for restricting the edge roll-off at least to an outer edge region. By means of the subsequent epitaxial coating it has not been possible heretofore to achieve a further improvement, especially as the narrow specifications for the layer thickness regularity of the epitaxial layer did not permit an epitaxial layer to be deposited in a manner that could have compensated for the edge roll-off. Therefore, all epitaxially coated silicon wafers known at the date of the invention had unsatisfactory edge roll-off values. The invention now for the first time makes it possible to provide epitaxially coated silicon wafers which, with regard to their edge roll-off, meet the requirements made of starting materials for electronic components of future generations of technology.

The silicon wafer according to the invention is preferably a wafer made of monocrystalline silicon, an SOI wafer, a wafer having a strained silicon layer, or an sSOI wafer, provided with an epitaxial layer at least in its front side.

EXAMPLE

Determination of the initial geometry of a concavely polished silicon wafer prior to pretreatment/epitaxy resulted in the following R30 values: an R30-1 mm of −120 nm, an R30-2 mm of 50 nm and an R30-3 mm of −30 nm.

This concavely polished silicon wafer was epitaxially coated according to the invention, the following process parameters having been chosen: heating of the susceptor without a substrate to 1100° C.; $H_2$ bake pretreatment with $H_2$ flow rate of 60 slm and treatment duration of 20 s; HCl etching treatment with $H_2$ flow rate of 50 slm and treatment duration of 60 s; epitaxial deposition by means of TCS at a deposition temperature of 1120° C., a TCS flow rate of 17 slm, and deposition duration of 63 sec. For the epitaxially coated silicon wafer, a significantly better value of −7 nm results for the R30-1 mm edge roll-off parameter. At a distance of 2 mm and 3 mm from the edge, the curve averaged over all the radial cross sections lies above the reference line. The R30-3 mm is +21 nm and the R30-2 mm is +30 nm. This involves a roll-up.

As a result of the pretreatment steps, silicon was deposited on the rear side of the silicon wafer in an amount of approximately 110 nm at R-1 mm, approximately 80 nm at R-2 mm and approximately 50 nm at R-3 mm. By increasing the HCl etching treatment duration to 100 s, it is possible to further increase the deposition on the rear side of the silicon wafer. As a result, it is possible to overcompensate for the original edge roll-off of −120 nm at R-1 mm and to set a roll-up of +10 nm, for example, at R-1 mm. By means of an HCl treatment duration of approximately 90 s and maintaining all the other process parameters, the roll-off at 1 mm can be completely compensated for. The R30-1 mm is equal to zero in this case.

It has been shown that the R30-1 mm parameter of an epitaxially coated silicon wafer can be set to any desired value between −10 nm and +10 nm by means of optimized $H_2$ bake and HCl pretreatment steps. It has furthermore been shown that a complete compensation of the edge roll-off and the setting of a small roll-up are also possible with the aid of the method according to the invention.

Figure 1:
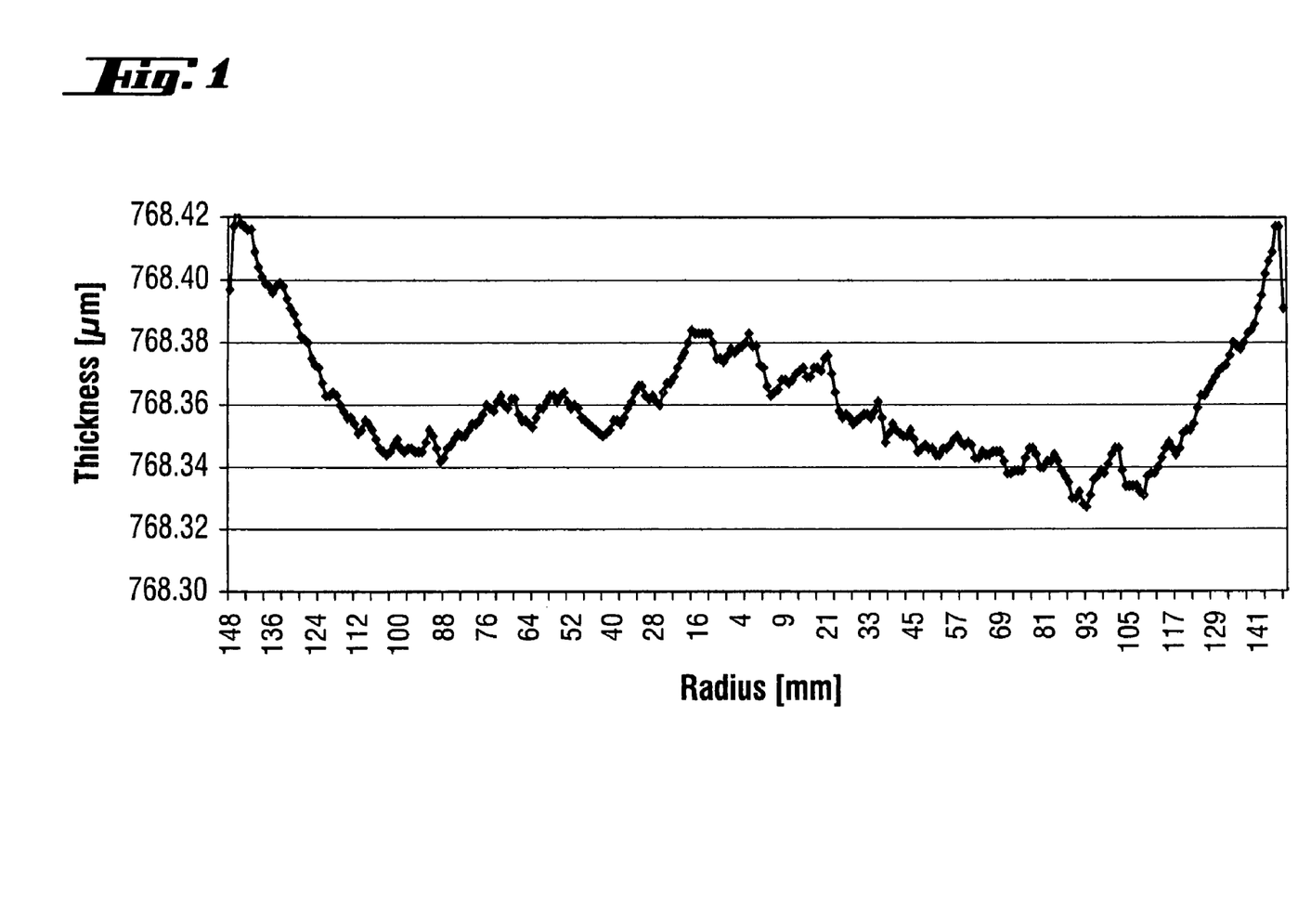
FIG. 1 shows the thickness of a polished silicon wafer plotted against its radius as a line scan.

In FIG. 1, the thickness of a polished silicon wafer having a diameter of 300 mm is plotted against its radius as a line scan. A significant decrease in thickness is apparent in the edge region. An edge exclusion of 2 mm is taken as a basis here.

Figure 2:
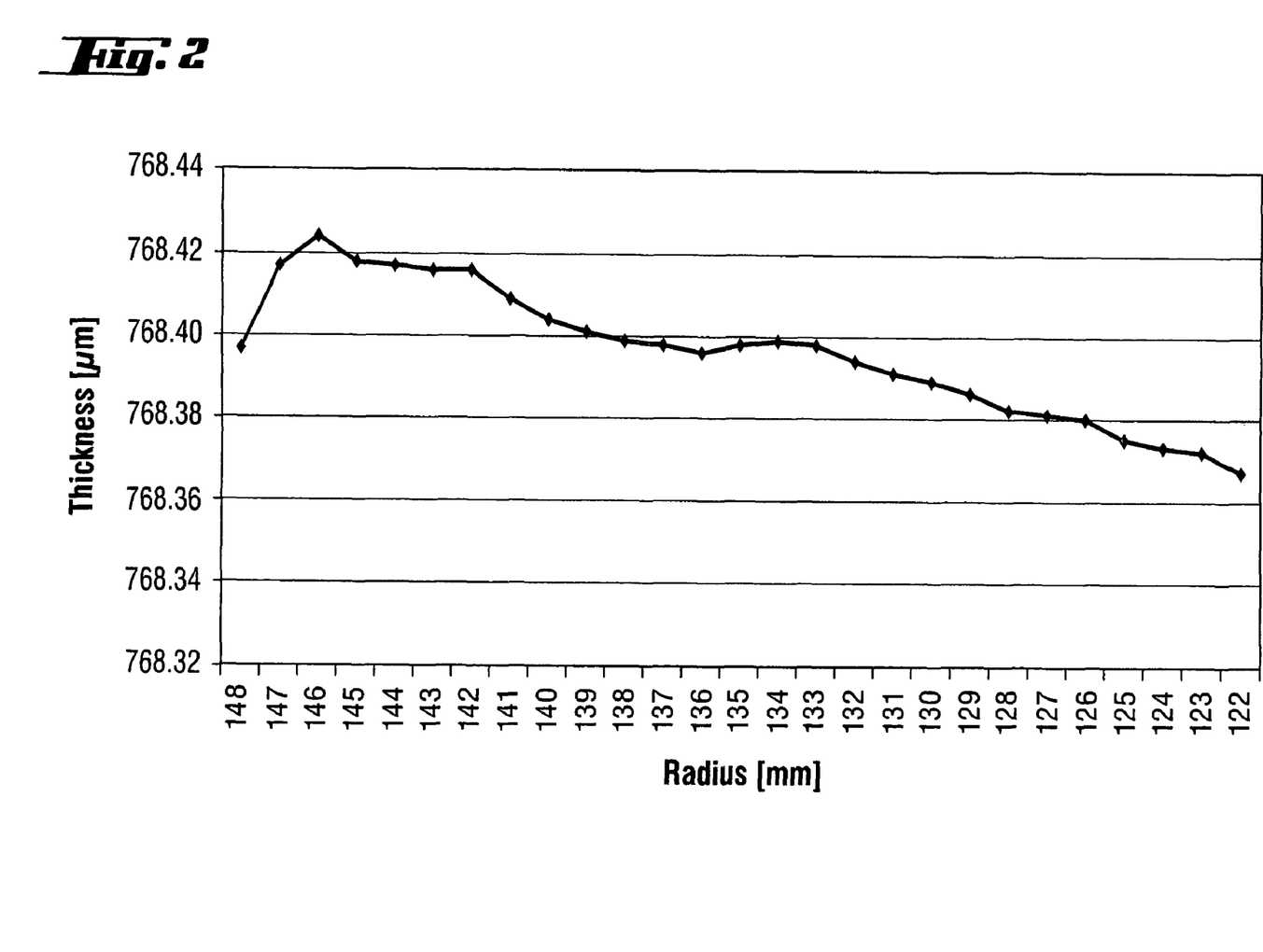
FIG. 2 shows the thickness of a polished silicon wafer as a line scan only in the edge region.

In FIG. 2 the thickness of the polished silicon wafer is plotted against a line scan restricted to an edge region of approximately 30 mm. It is apparent that the edge roll-off at a distance from the edge of the silicon wafer of −3 mm (measurement point 147) to −2 nm (measurement point 148) is approximately 0.02 μm.

Figure 3:
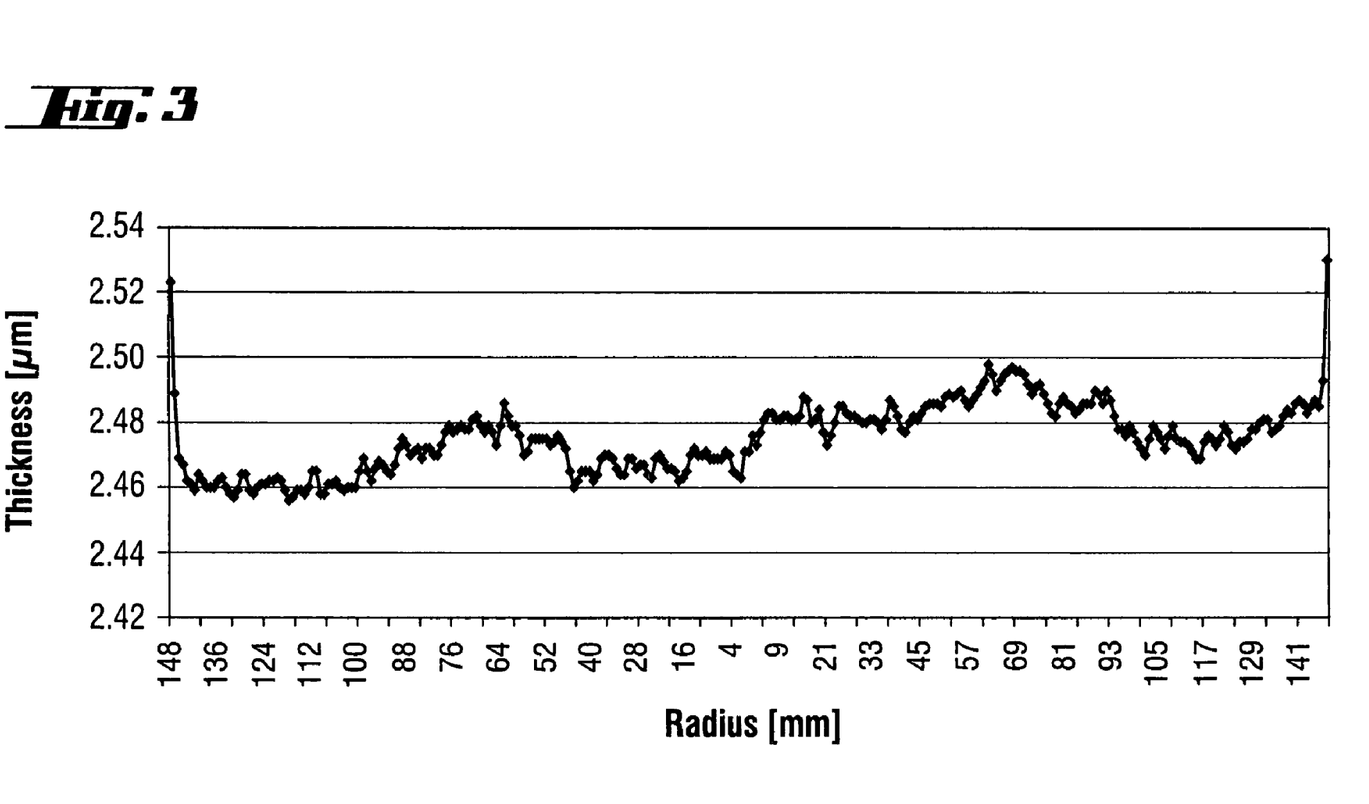
FIG. 3 shows the thickness of a deposited epitaxial layer on the silicon wafer plotted against its radius as a line scan.

FIG. 3 then illustrates the thickness of the layer applied to this polished silicon wafer against a line scan encompassing the entire diameter of the silicon wafer apart from an edge exclusion. The layer applied to the rear side during the pretreatment is also taken into account here. For this purpose, the measured values were determined by forming the difference in thickness between the epitaxially coated and polished starting wafer. It can be seen that a thicker layer was deposited in the edge region than toward the center of the wafer.

Figure 4:
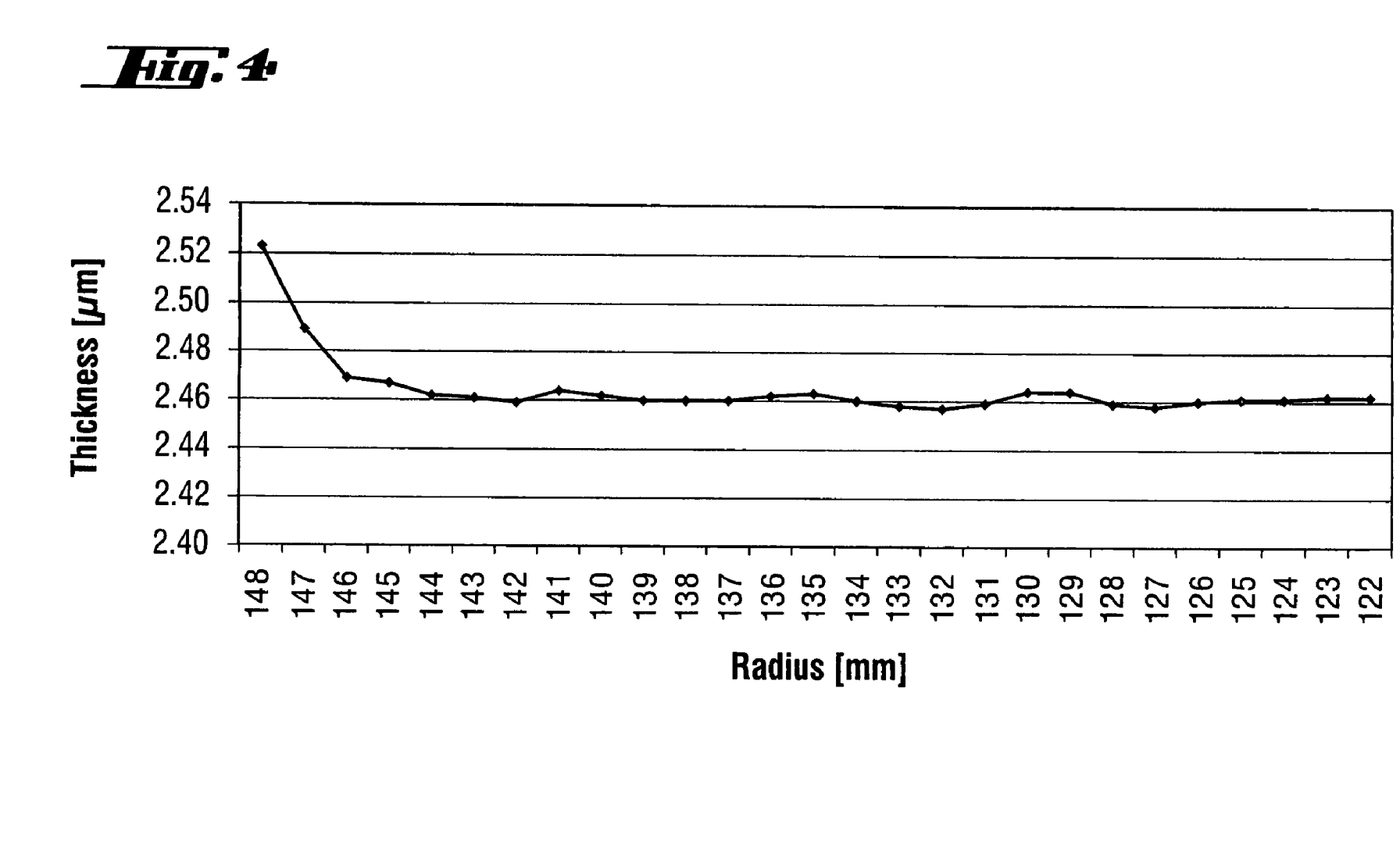
FIG. 4 shows the thickness of an epitaxial layer only in the edge region.

This becomes even clearer in FIG. 4, which shows the thickness of the epitaxial layer in the edge region. Between the measurement points 147 (−3 mm from the edge) and 148 (−2 mm), the difference in thickness is approximately 0.02 μm, that is to say corresponds to the edge roll-off exhibited by the polished silicon wafer prior to the epitaxial deposition. The decrease in thickness in the initial geometry is therefore compensated for by the epitaxial layer into an edge region of R-2 mm.

The following process parameters were used: heating of the susceptor without a substrate to 1100° C.; $H_2$ bake pretreatment with $H_2$ flow rate of 60 slm and treatment duration of 20 s; HCl etching treatment with $H_2$ flow rate of 50 slm and treatment duration of 40 s; epitaxial deposition by means of TCS at a deposition temperature of 1120° C., a TCS flow rate of 17 slm, and deposition duration of 63 sec.

Figure 5:
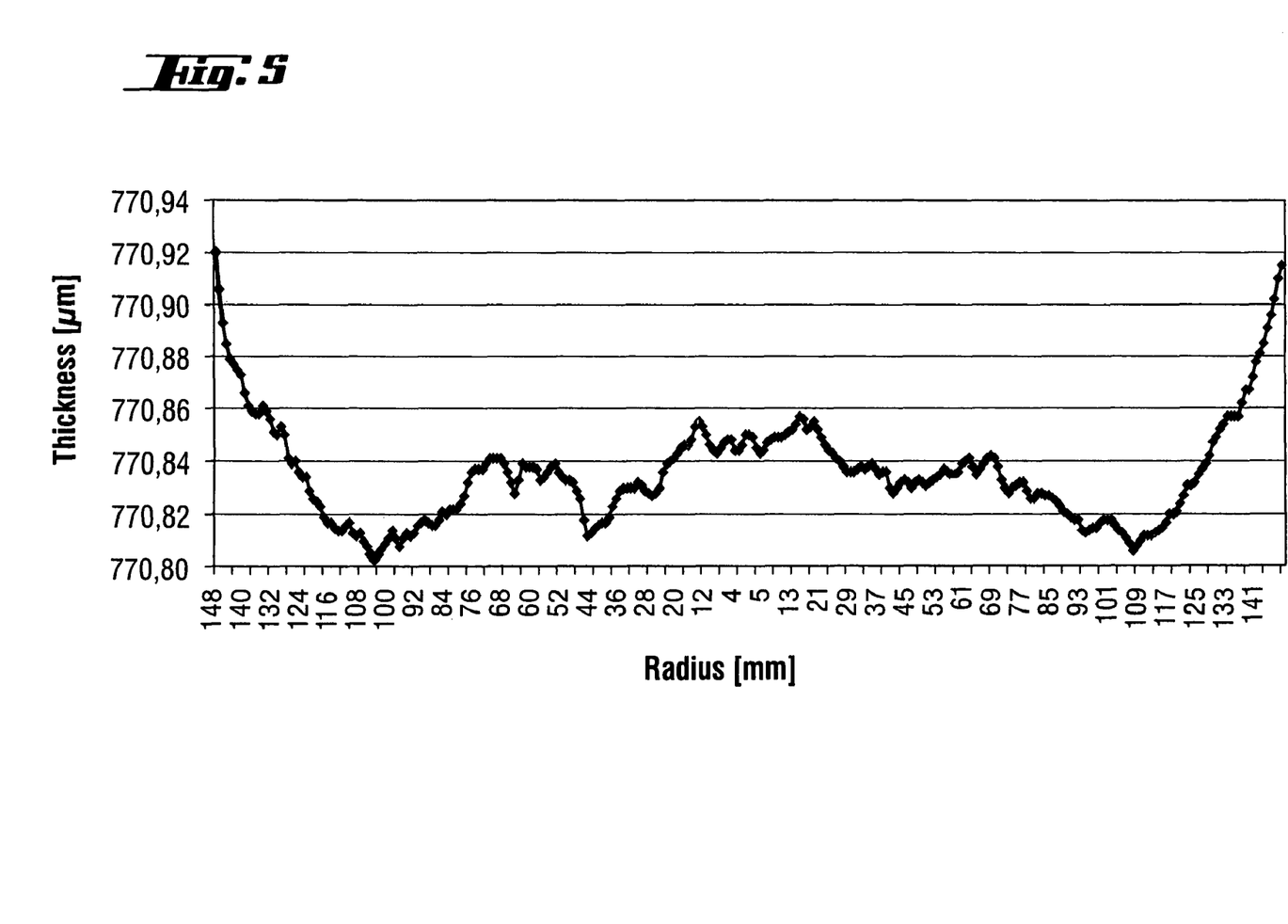
FIG. 5 shows the thickness of an epitaxially coated silicon wafer plotted against its radius as a line scan.

FIG. 5 illustrates the thickness of the epitaxially coated silicon wafer against a line scan. An edge roll-off is no longer apparent, given an edge exclusion of 2 mm. It has been completely compensated for by the epitaxial layer.

Figure 6:
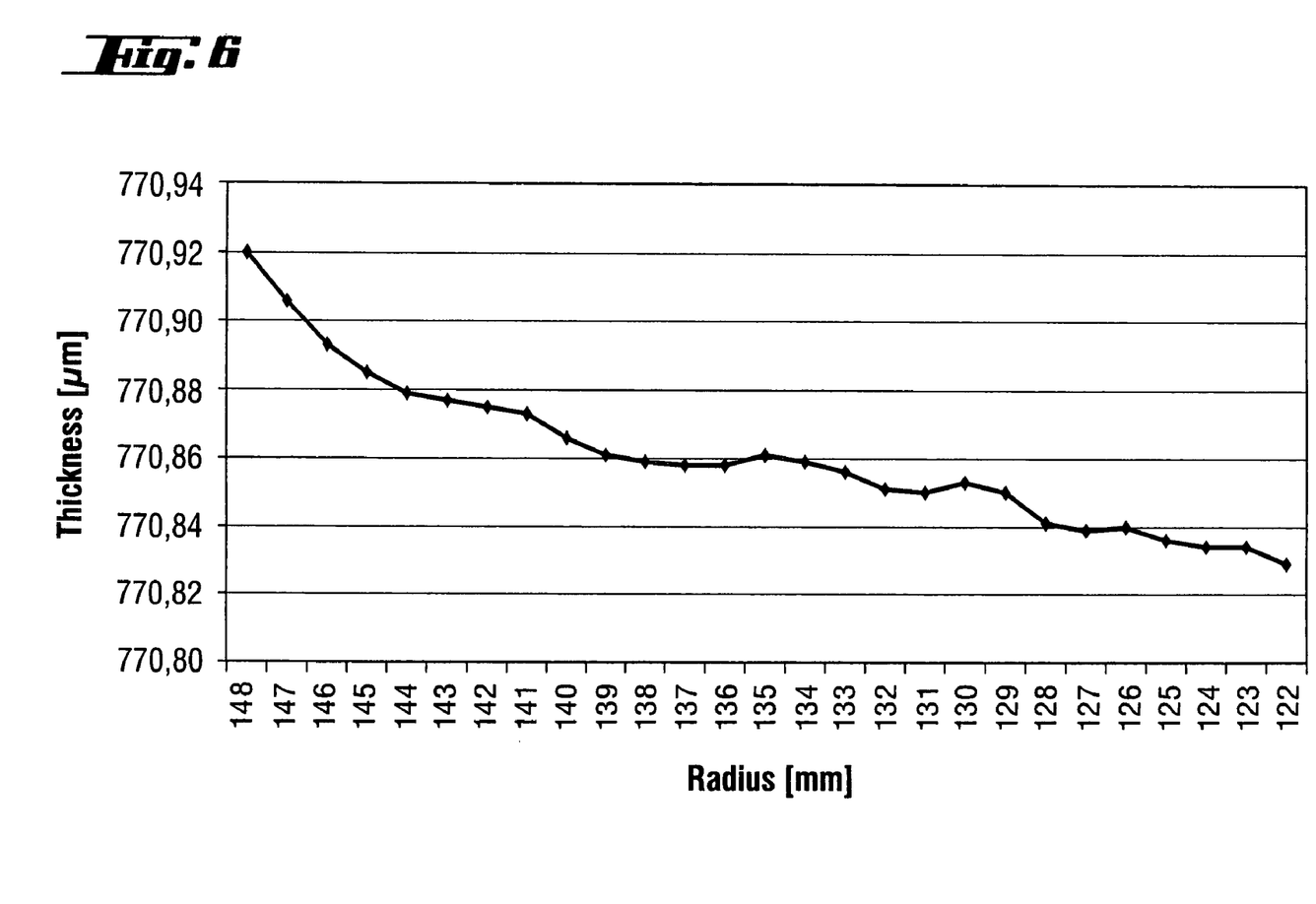
FIG. 6 shows the thickness of the epitaxially coated silicon wafer of FIG. 5 only in the edge region.

FIG. 6 illustrates the thickness of the epitaxially coated silicon wafer against an edge region of approximately 30 mm. The edge geometry of the epitaxially coated silicon wafer has significantly improved. No roll-off is discernible given an edge exclusion of 2 mm.

Figure 7:
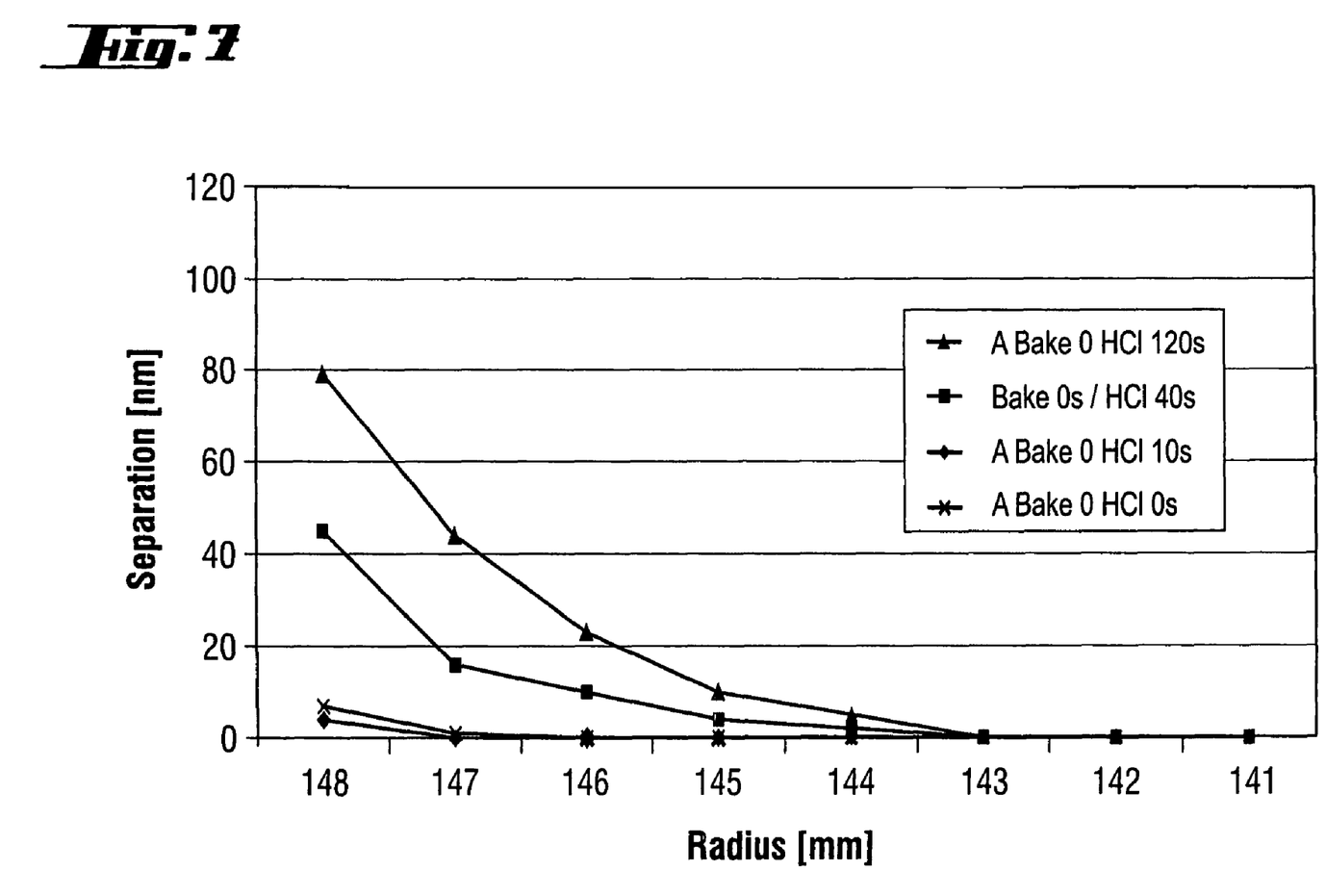
FIG. 7 shows the thickness of an epitaxially deposited layer on a silicon wafer as a line scan for various treatment durations with HCl without an $H_2$ bake.

FIG. 7 illustrates in each case the thickness of an epitaxial layer applied in the edge region on the rear side of a silicon wafer against a line scan, for four various HCl pretreatment durations. A pretreatment under a hydrogen atmosphere (bake) is not carried out in any instance. It is apparent that by varying the duration of the etching treatment, it is possible, to apply layer thicknesses of 10 to 80 nm at a distance of 2 mm from the edge of the silicon wafer in a targeted manner. With longer etching treatment durations it is apparent that an epitaxial layer is also deposited further inward, which is connected with the fact that the oxide on the rear side was etched away to further inward by longer etching. The epitaxial deposition was effected in each case by means of TCS at a deposition temperature of 1120° C. and a TCS flow rate of 17 slm for 63 sec. The $H_2$ flow rate was 50 slm in each case. The susceptor was heated beforehand without a substrate to 1100° C.

Figure 8:
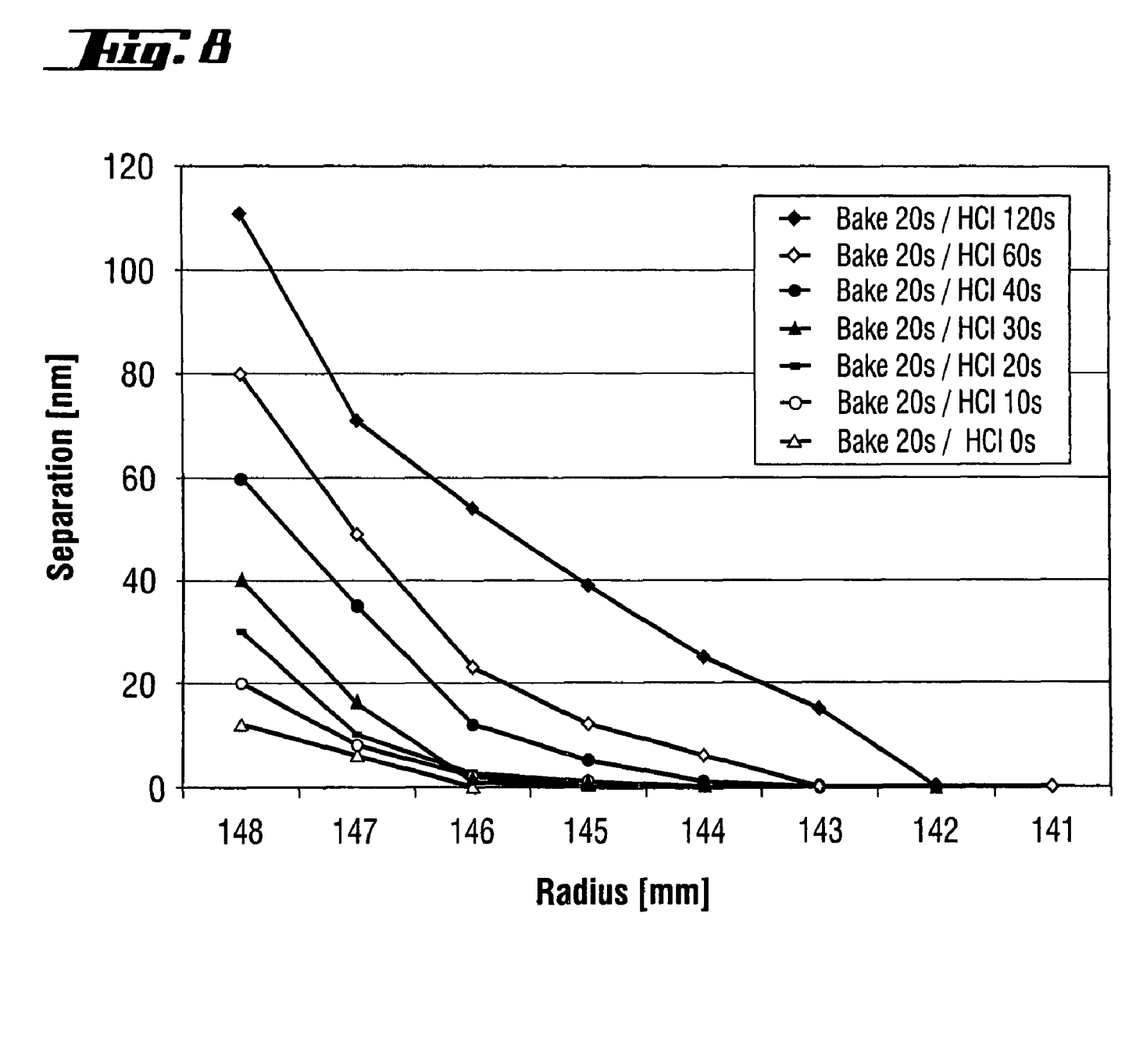
FIG. 8 shows the thickness of an epitaxially deposited layer on a silicon wafer as a line scan for various treatment durations with HCl and, in each case, an $H_2$ bake treatment of 20 seconds.

FIG. 8 illustrates the thickness of an epitaxial layer applied to the rear side of a silicon wafer against a line scan, for seven different HCl pretreatment durations. A pretreatment under a hydrogen atmosphere (bake) of 20 seconds is carried out in each instance. It is apparent that by varying the etching treatment duration from 0 to 120 seconds it is possible, to apply layer thicknesses of 10 to 110 nm at a distance of 2 mm from the edge in a targeted manner. With longer etching treatment durations it is apparent that an epitaxial layer is also deposited further inward, due to the fact that the oxide on the rear side was etched away further inward by longer etching. The epitaxial deposition was effected in each case by means of TCS at a deposition temperature of 1120° C. and a TCS flow rate of 17 slm for 63 sec. The $H_2$ flow rate was in each case 60 slm during the $H_2$ pretreatment and 50 slm during the HCl treatment. The susceptor was heated beforehand without a substrate to 1100° C.

Figure 9:
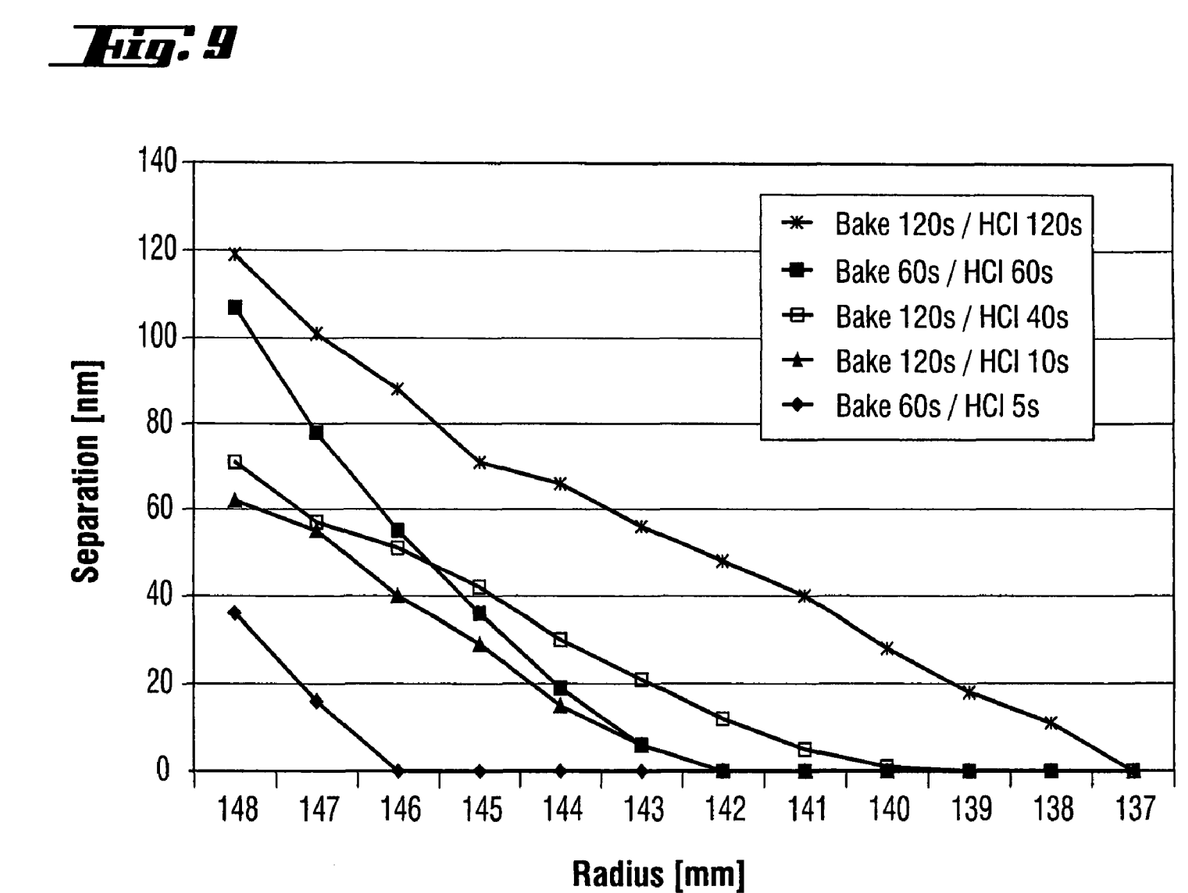
FIG. 9 shows the thickness of an epitaxially deposited layer on a silicon wafer as a line scan for various treatment durations with HCl and an $H_2$ bake treatment of 60 or 120 seconds.

FIG. 9 illustrates the thickness of an epitaxial layer applied to the rear side of a silicon wafer plotted against radius as a line scan, for five different HCl pretreatment durations. A pretreatment under a hydrogen atmosphere (bake) of 60 or 120 seconds is carried out in each instance. It is apparent that by varying of the etching treatment duration it is possible, to apply layer thicknesses of 30 to 120 nm in the edge region on the rear side of the silicon wafer in a targeted manner. With longer etching treatment durations it is apparent that an epitaxial layer is also deposited further inward, due to native oxide on the rear side being etched away further inward by longer etching. Thus, with $H_2$ bake and HCl treatment durations of 120 seconds in each case, a deposition is effected right into a region of a distance of 13 mm from the edge (measurement point 137 mm). The epitaxial deposition was effected in each case by means of TCS at a deposition temperature of 1120° C. and a TCS flow rate of 17 slm for 63 sec. The $H_2$ flow rate was in each case 60 slm during the $H_2$ pretreatment and 50 slm during the HCl treatment. The susceptor was heated beforehand without a substrate to 1100° C.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing epitaxially coated silicon wafers, in which a multiplicity of silicon wafers which are polished at least on their front sides are provided and successively and individually coated in an epitaxy reactor, comprising:
    placing one of the silicon wafers on a susceptor in the epitaxy reactor, pretreating the wafer under a hydrogen atmosphere in a first step, adding an etching medium to the hydrogen atmosphere in a second step, subsequently epitaxially coating the wafer on its polished front side, and removing the wafer from the epitaxy reactor, and afterwards heating the susceptor to a temperature of at least 1000° C. under a hydrogen atmosphere, and after a specific number of epitaxial coatings etching the susceptor followed by a momentary coating of the susceptor with silicon
wherein the silicon wafer is characterized by a parameter R30 -1 mm of −10 nm to +10 nm, corresponding to a deviation, at a distance of 1 mm from the edge of the silicon wafer, of an average thickness cross section with respect to a reference line determined by regression.

2. The method of claim 1, wherein the treatment in a hydrogen atmosphere is effected at a hydrogen flow rate of 0-100 slm for a duration of up to 120 s.

3. The method of claim 2, wherein the treatment in the hydrogen atmosphere is effected at a hydrogen flow rate of 30-60 slm.

4. The method of claim 1, wherein the pretreatment with addition of etching medium into the hydrogen atmosphere is effected at a hydrogen flow rate of 0-100 slm for a duration of up to 120 s.

5. The method of claim 4, wherein the pretreatment with addition of an etching medium into the hydrogen atmosphere is effected at a hydrogen flow rate of 30-60 slm.

6. The method of claim 1, wherein the susceptor is heated to a temperature of at least 1100° C.

7. The method of claim 1, wherein the susceptor, after being heated to a temperature, is kept at that temperature for 5-15 s.

8. The method of claim 1, wherein trichlorosilane is used as a source gas during the epitaxial coating at a deposition temperature of 1050-1150° C.

9. The method of claim 1, wherein hydrogen chloride is used as the etching medium during the treatment of the susceptor and during pretreatment of the silicon wafer.

10. The method of claim 1, wherein the silicon wafers provided are wafers of monocrystalline silicon, SOI wafers, wafers having a strained silicon layer, or sSOI wafers.

11. A silicon wafer having a front side and a rear side, at least the front side being polished and having an epitaxial layer on its front side, characterized by a parameter R30-1 mm of −10 nm to +10 nm, corresponding to a deviation, at a distance of 1 mm from the edge of the silicon wafer, of an average thickness cross section with respect to a reference line determined by regression.

12. The silicon wafer of claim 11, having a parameter R30-1 mm of −5 nm to +5 nm.

13. The silicon wafer of claim 11, wherein the epitaxial layer has a thickness of 0.5 to 5 μm.

14. The silicon wafer of claim 11, wherein the silicon wafer is a wafer made of monocrystalline silicon, an SOI wafer, a wafer having a strained silicon layer, or an sSOI wafer with an epitaxial coating.

* * * * *